United States Patent [19]

Hill

[11] Patent Number: 5,789,301
[45] Date of Patent: Aug. 4, 1998

[54] METHOD FOR REDUCING EXTRINSIC BASE-COLLECTOR CAPACITANCE

[75] Inventor: Darrell Glenn Hill, Plano, Tex.

[73] Assignee: TriQuint Semiconductor, Inc., Hillsboro, Oreg.

[21] Appl. No.: 736,648

[22] Filed: Oct. 25, 1996

Related U.S. Application Data

[60] Continuation of Ser. No. 479,739, Jun. 7, 1995, abandoned, which is a division of Ser. No. 285,601, Aug. 3, 1994, Pat. No. 5,525,818, which is a continuation of Ser. No. 112,009, Aug. 25, 1993, abandoned, which is a division of Ser. No. 938,190, Aug. 31, 1992, Pat. No. 5,298,438.

[51] Int. Cl.$^6$ ............................................. H01L 21/8222
[52] U.S. Cl. ............. 438/319; 438/312; 438/320; 438/739; 257/197; 257/200; 148/DIG. 51; 148/DIG. 72
[58] Field of Search ............. 437/31, 131, 228 SE, 437/228 H, 228 O, 228 ION, 912; 148/DIG. 72, DIG. 51; 438/312, 319, 320, 739; 257/200, 197

[56] References Cited

U.S. PATENT DOCUMENTS

| | | | |
|---|---|---|---|
| 4,746,626 | 5/1988 | Eda et al. | 437/107 |
| 4,825,265 | 4/1989 | Lunardi et al. | 357/16 |
| 4,914,489 | 4/1990 | Awano | 357/16 |
| 4,967,252 | 10/1990 | Awano | 357/34 |
| 5,002,901 | 3/1991 | Kurtz et al. | 437/228 |
| 5,019,890 | 5/1991 | Ishibashi et al. | 357/34 |
| 5,024,958 | 6/1991 | Awano | 437/31 |
| 5,070,028 | 12/1991 | Tews et al. | 437/22 |
| 5,124,270 | 6/1992 | Morizuka | 437/31 |
| 5,171,697 | 12/1992 | Liu et al. | 437/31 |
| 5,266,819 | 11/1993 | Chang et al. | 257/198 |
| 5,270,223 | 12/1993 | Liu | 437/31 |
| 5,298,438 | 3/1994 | Hill | 437/31 |
| 5,344,786 | 9/1994 | Bayraktaroglu | 437/31 |
| 5,434,091 | 7/1995 | Hill et al. | 437/31 |
| 5,445,976 | 8/1995 | Henderson et al. | 437/31 |

FOREIGN PATENT DOCUMENTS

| | | |
|---|---|---|
| 62-299072(A) | 12/1987 | Japan. |
| 2-235341(A) | 9/1990 | Japan. |
| 3-108339(A) | 5/1991 | Japan. |
| 3-291942(A) | 12/1991 | Japan. |

Primary Examiner—John Niebling
Assistant Examiner—Long Pham
Attorney, Agent, or Firm—Skjerven, Morrill, MacPherson, Franklin & Friel LLP

[57] ABSTRACT

This is a method of fabricating a heterojunction bipolar transistor on a wafer. The method can comprise: forming a doped subcollector layer 31 on a semiconducting substrate 30; forming a doped collector layer 32 on top of the collector layer, the collector layer doped same conductivity type as the subcollector layer; forming a doped base epilayer 34 on top of the collector layer, the base epilayer doped conductivity type opposite of the collector layer; forming a doped emitter epilayer 36, the emitter epilayer doped conductivity type opposite of the base layer to form the bipolar transistor; forming a doped emitter cap layer 37 on top of the emitter epilayer, the emitter cap layer doped same conductivity as the emitter epilayer; forming an emitter contact 38 on top of the emitter cap layer; forming a base contact on top of the base layer; forming a collector contact on top of the collector layer; and selective etching the collector layer to produce an undercut 45 beneath the base layer.

16 Claims, 8 Drawing Sheets

METHOD FOR REDUCING EXTRINSIC BASE-COLLECTOR CAPACITANCE

This application is a Continuation of application Ser. No. 08/479,739 filed Jun. 7, 1995 now abandoned which is a Divisional of application Ser. No. 08/285,601 filed Aug. 3, 1994, now U.S. Pat. No. 5,525,818 which is a Continuation of aplication Ser. No. 08/112,009 filed Aug. 25, 1993, now abandoned which is a Divisional of application Ser. No. 07/938,190 filed Aug. 31, 1992 now U.S. Pat. No. 5,298,438.

FIELD OF THE INVENTION

This invention generally relates to reducing extrinsic base-collector capacitance in bipolar transistors.

BACKGROUND OF THE INVENTION

Without limiting the scope of the invention, its background is described in connection with the manufacturing of bipolar transistors, as an example.

Heretofore, in this field, in bipolar mesa transistors, the base layer extends outside the area of the active device region to enable contacting of the base. This area is called the extrinsic base region, outside the active device region, and it increases the junction capacitance between the base layer and the layer beneath the base (e.g. the collector, in emitter-up devices).

Since junction capacitance limits the high-frequency performance of bipolar transistors, great effort has been spent on reducing the junction capacitance between the base layer and the layer beneath the base. Accordingly, improvements which overcome any or all of the problems are presently desirable.

SUMMARY OF THE INVENTION

It is herein recognized that a need exists for a method to manufacture a bipolar transistor which reduces the junction capacitance between the base layer and the layer beneath the base. The present invention is directed towards meeting that need.

Generally, and in one form of the invention, during device fabrication, the layer beneath the base is etched laterally; a selective etch is used so that the base layer itself is not significantly affected. The area of the junction between the base and the underlying layer can be significantly reduced.

The selective etching can be accomplished in at least two ways: by including an epitaxial layer in the layer beneath the base which can be selectively removed during fabrication; or by using a doping-selective etch which, for NPN transistors, removes only N-type material but not P-type material (or vice versa for PNP transistors).

Previous partial solutions include minimization of the base contact area and ion bombardment of the extrinsic base region.

Minimization of the base contact area involves a design tradeoff between base resistance (which improves with increasing contact area) and junction capacitance (which degrades with increasing contact area). In contrast, the invention makes the junction capacitance almost independent of base contact area.

Ion bombardment reduces the effective doping density of the layer beneath the base in the extrinsic base region. At best, this approach insures that the layer is depleted of free carriers, so that the dielectric thickness is increased. For example, in the case of a conventional emitter-up AlGaAs/GaAs heterojunction bipolar transistor, if ion bombardment is used in the extrinsic base region, then the capacitance C per unit area in this region is determined by the collector thickness t and the dielectric contact of collector material (e.g. GaAs):

$$C = \epsilon_{GaAs}/t$$

In contrast, if the current solution is applied to the heterojunction bipolar transistor, the capacitance per unit area in the region is no greater than $$C = \epsilon_{air}/d$$

where d is the vertical thickness of the undercut layer and $\epsilon_{air}$ is the dielectric constant of air. Since $\epsilon_{GaAs}/\epsilon_{air} \approx 13$ (and the entire collector layer may be undercut if desired, so that d=t), the capacitance reduction improvement, compared to the ion bombardment approach, is considerably greater.

An additional advantage of the invention is the improvement of the current gain and base resistance compared to the ion bombardment approach. For emitter-up structures, current gains is improved somewhat because the minority carrier lifetime in the extrinsic base is not degraded. Base resistance is improved because the base layer does not undergo ion bombardment. Also, since the junction capacitances are not significantly affected by base contact area, the contact area can be increased to further reduce base resistance.

This invention would be of great use in, although not limited to, microwave amplification or oscillator applications requiring Heterojunction bipolar transistors (HBT) devices to operate above 20 GHz, since conventional HBTs are usually sufficient at lower frequencies.

This is a method of fabricating a heterojunction bipolar transistor on a wafer. This method can comprise: forming a doped subcollector layer on a substrate; forming a doped collector layer on top of the subcollector layer, the collector layer being doped same conductivity type as the subcollector layer; forming a doped base epilayer on top of the collector layer, the base epilayer being doped conductivity type opposite of the collector layer; forming a doped emitter epilayer, the emitter epilayer being doped conductivity type opposite of the base layer to form the bipolar transistor; forming a doped emitter cap layer on top of the emitter epilayer, the emitter cap layer being doped same conductivity as the emitter epilayer; forming an emitter contact on top of the emitter cap layer; etching of the emitter and emitter cap layers to expose the base layer; forming a base contact on top of the base layer; etching of the base y and collector layer to expose the subcollector; selective etching a portion of the collector layer to produce an undercut beneath the base layer; and forming a collector contact on top of the subcollector layer.

Preferably, the collector layer is composed of or contains an AlGaAs layer and the subcollector layer is composed of GaAs and the AlGaAs collector layer is selectively etched to produce the undercut region beneath the base layer.

In one embodiment, the base layer, the emitter layer, and the collector layer are composed of silicon. At least the base layer and emitter layers may be epilayers.

BRIEF DESCRIPTION OF THE DRAWINGS

The drawings are schematic and the vertical has been exaggerated for clarity.

DETAILED DESCRIPTION OF THE DRAWINGS

The first preferred embodiment method for fabricating bipolar transistors includes the following steps as illustrated in cross sectional elevation views in FIGS. 1–10.

Figure 1:
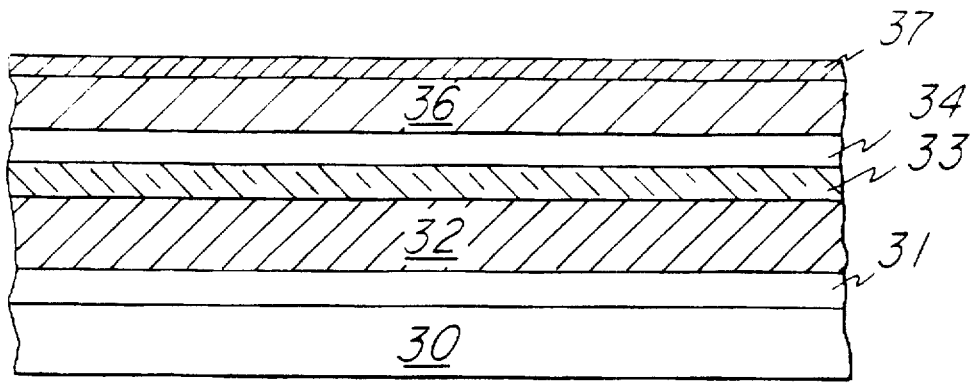
FIGS. 1–10 are cross sectional elevation views of the first preferred embodiment and the steps of the preferred embodiment fabrication method.

In FIG. 1, a substrate material 30 is composed of a semiconductor material, such as GaAs. A GaAs subcollector layer 31 is grown by, for example molecular beam epitaxy, with n-type doping of $3\times10^{18}$ cm$^{-3}$ Si and thickness of 500 nm. A collector layer is grown consisting of 500 nm doped n-type at $3\times10^{16}$ cm$^{-3}$. The collector layer is composed of AlGaAs layer 32 and an optional GaAs layer 33. A base epilayer 34 of GaAs is deposited on to the collector 32 at a thickness of 50 nm and doped with C at a concentration of $5\times10^{19}$ cm$^{-3}$. Emitter epilayer 36 of n-type AlGaAs is deposited onto base layer 34 at a thickness of 50 nm and doping of $2\times10^{17}$ cm$^{-3}$. A GaAs emitter cap layer 37 is then deposited with thickness of 300 nm and doping of $5\times10^{18}$ cm$^{-3}$.

Figure 2:
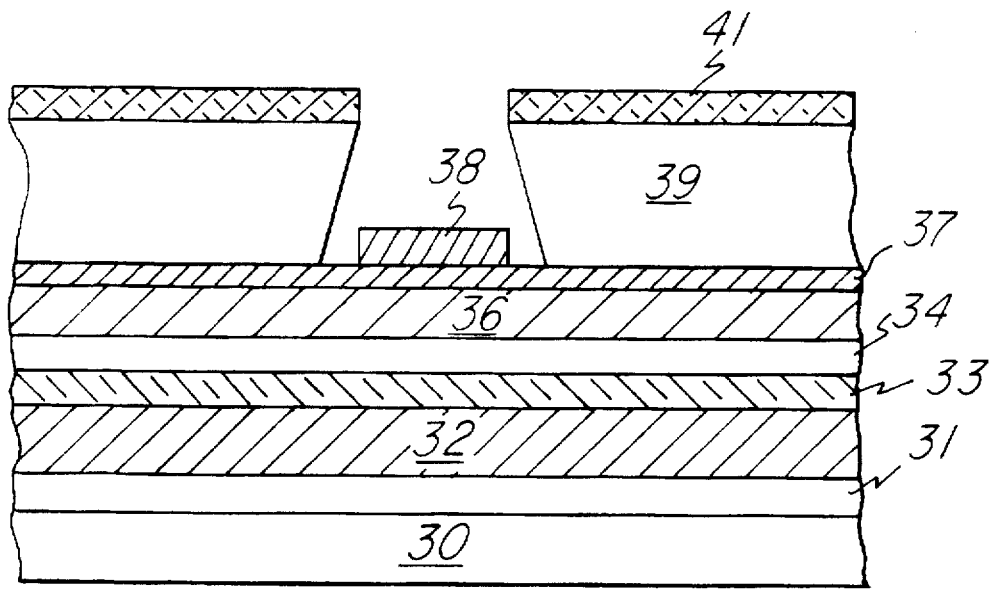

In FIG. 2, photoresist 39 is applied and patterned by lithography. Emitter contact metal 38 is then evaporated, consisting of 50 nm AuGe, 14 nm Ni, and 200 nm Au. The excess metal 41 on top of the photoresist 39 is then lifted off by dissolving the photoresist in acetone.

Figure 3:
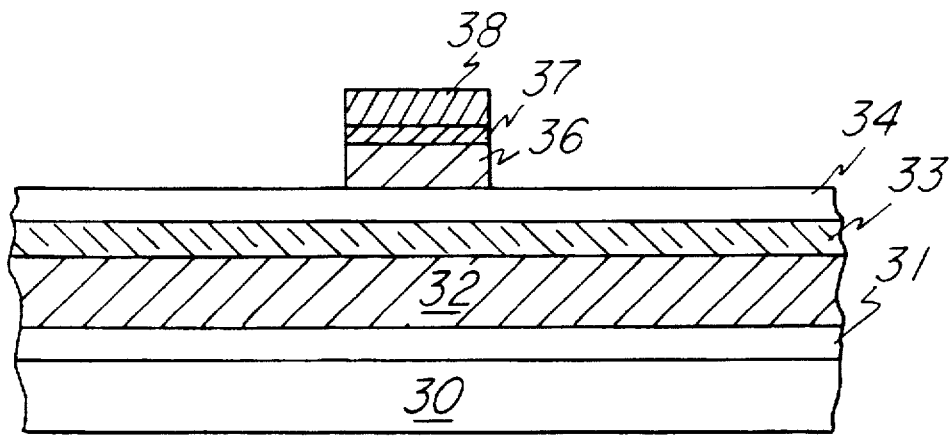

In FIG. 3, the emitter cap 37 and the emitter layer 36 are etched using the emitter contact 38 as a mask.

Figure 4:
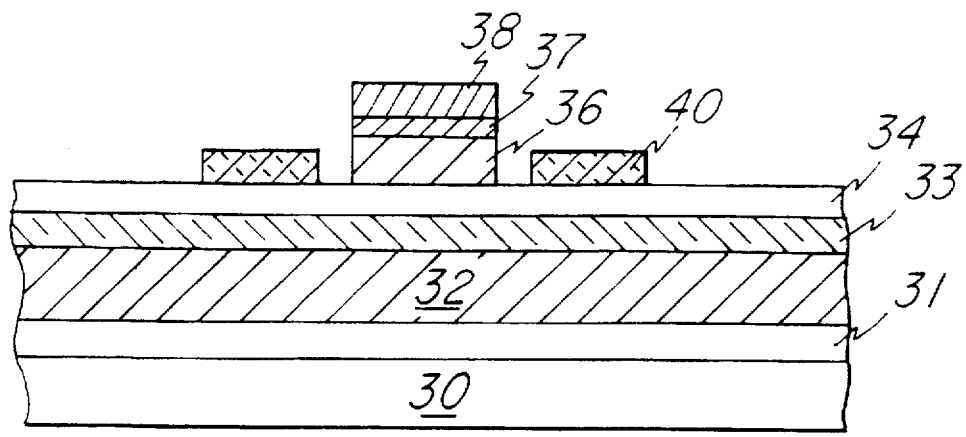

In FIG. 4, the base contacts 40 are evaporated onto the base layer 34 using a lift-off process. The base contact metal consists of 50 nm Ti, 25 nm Pt, and 200 nm Au.

Figure 5:
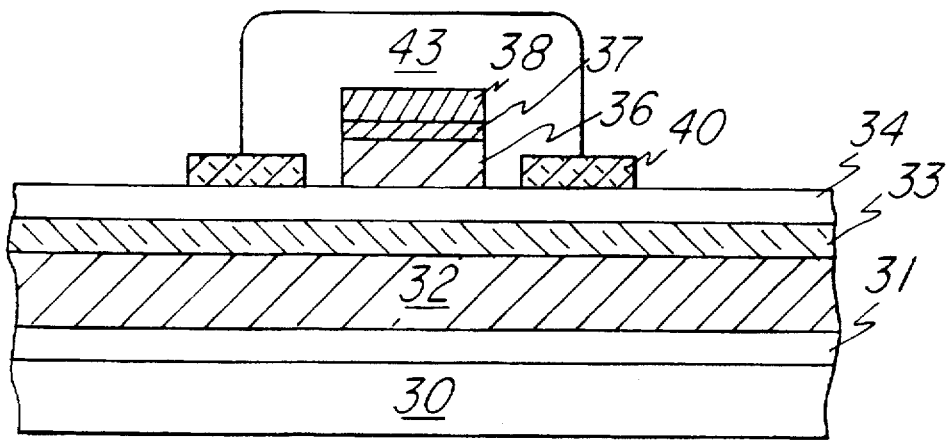

In FIG. 5, a layer of photoresist 43 is deposited and patterned over the emitter and portions of the base contacts.

Figure 6:
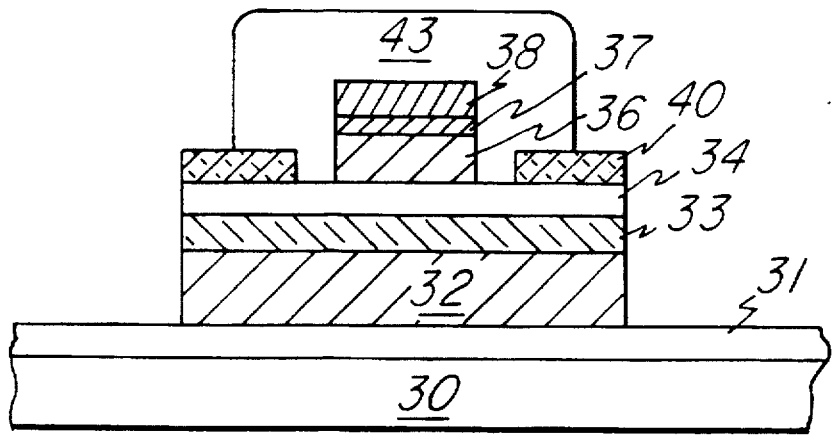

In FIG. 6, the base layer 34 and the collector layers 32 and 33 are etched using the base contact 40 and photoresist 43 as a mask.

Figure 7:
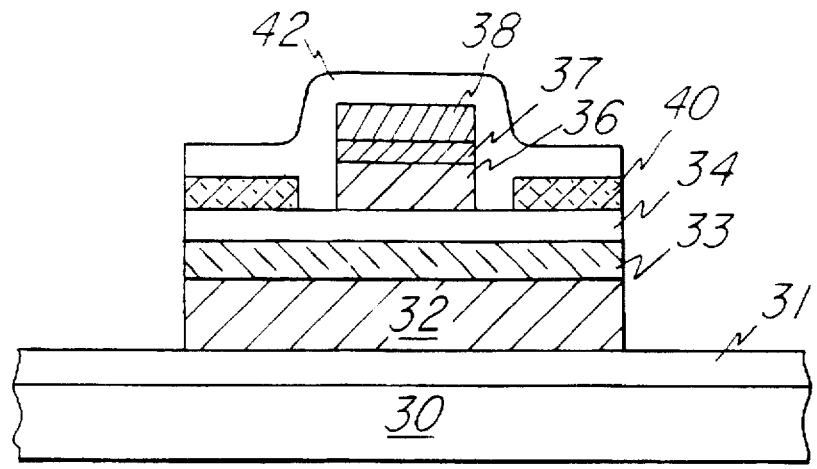

In FIG. 7, a layer of silicon nitride is deposited over the base contact 40, the emitter 36 and the emitter contact 38 to protect the AlGaAs in the emitter.

Figure 8:
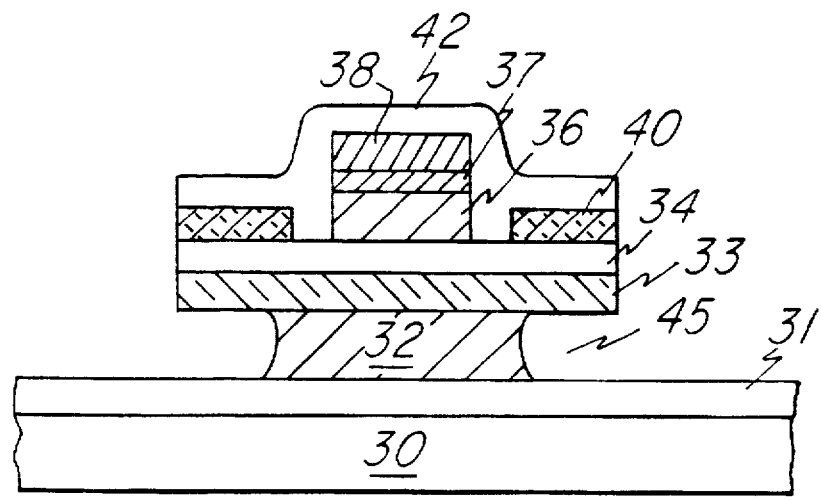

In FIG. 8, a timed selective etch is used to etch the AlGaAs of the collector layer 32 and produce an undercut 45 beneath the base layer 34.

Figure 9:
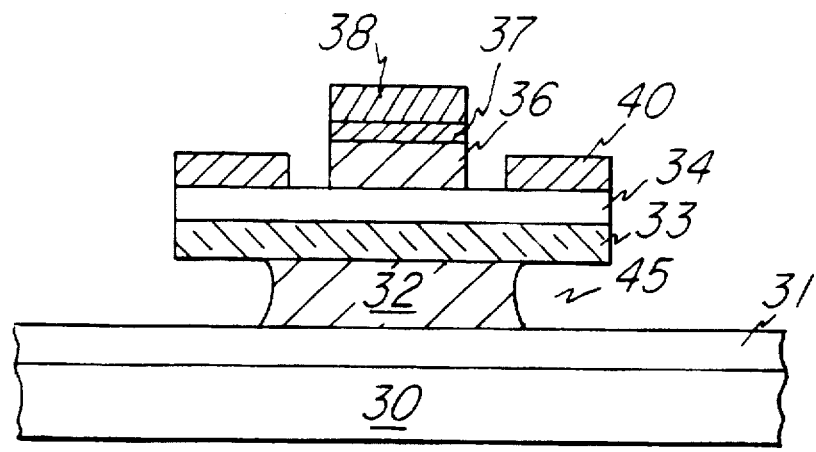

In FIG. 9, the layer of silicon nitride is removed.

Figure 10:
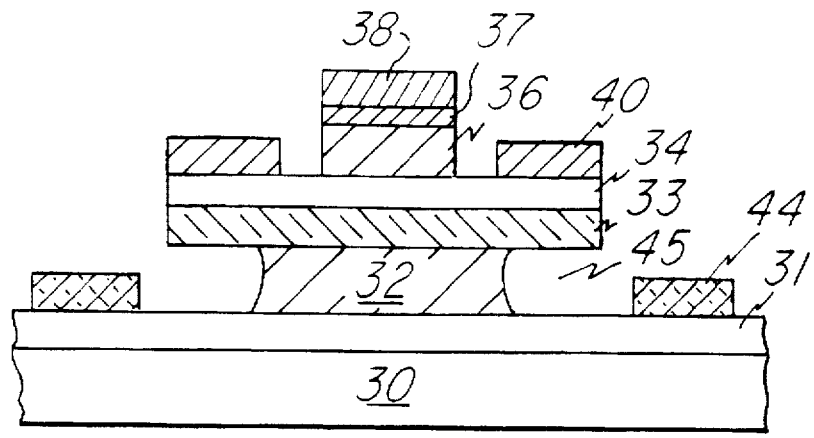

In FIG. 10, 50 nm thick AuGe emitter ohmic contact metal, followed by 14 nm Ni and 200 nm Au layers are evaporated onto the subcollector 31 using a lift-off process to make the collector contact 44. The contacts are then alloyed by heating to 430 degrees Celsius for 1 minute.

The second preferred embodiment method for fabricating high power heterojunction bipolar transistors (HBTs) includes the following steps as illustrated in cross sectional elevation views in FIGS. 11–22. In the second preferred embodiment, ion implantation is used to convert the upper portion of the collector in the extrinsic base region to the doping type of the base to reduce the extrinsic base resistance. The base-collector capacitance is not affected by this implant, because the implanted material is separated from the collector by the air gap produced by the undercut etch.

The fabrication of the second preferred embodiment is similar to that of the first embodiment, except that after the etch to the base and before forming the base contacts, dopant is introduced to the extrinsic base region by diffusion or ion implantation. The emitter metal or photoresist may be used to protect the active device region under the emitter contact.

Figure 11:
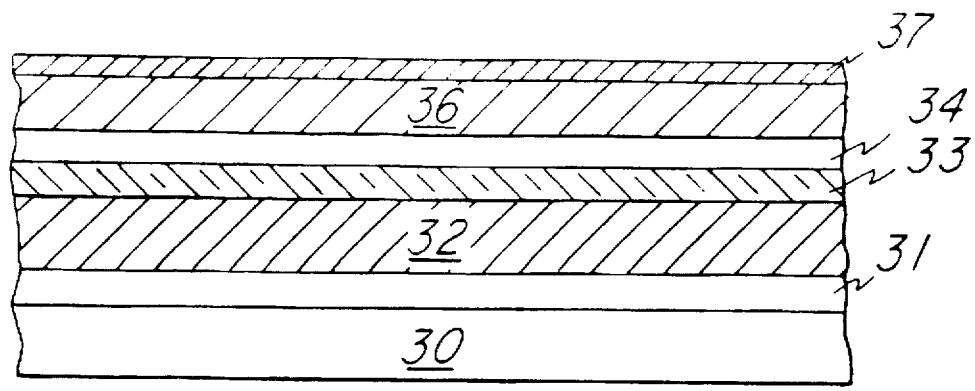

In FIG. 11, a substrate material 30 is composed of a semiconductor material, such as GaAs. A GaAs subcollector layer 31 is grown by, for example molecular beam epitaxy, with n-type doping of $3\times10^{18}$ cm$^{-3}$ Si and thickness of 500 nm. A collector layer is grown consisting of 500 nm doped n-type at $3\times10^{16}$ cm$^{-3}$. The collector layer is composed of AlGaAs layer 32 and an optional GaAs layer 33. A base epilayer 34 of GaAs is deposited on to the collector 32 at a thickness of 50 nm and doped with C at a concentration of $5\times10^{19}$ cm$^{-3}$. Emitter epilayer 36 of n-type AlGaAs is deposited onto base layer 34 at a thickness of 50 nm and doping of $2\times10^{17}$ cm$^{-3}$. A GaAs emitter cap layer 37 is then deposited with thickness of 300 nm and doping of $5\times10^{18}$ cm$^{-3}$.

Figure 12:
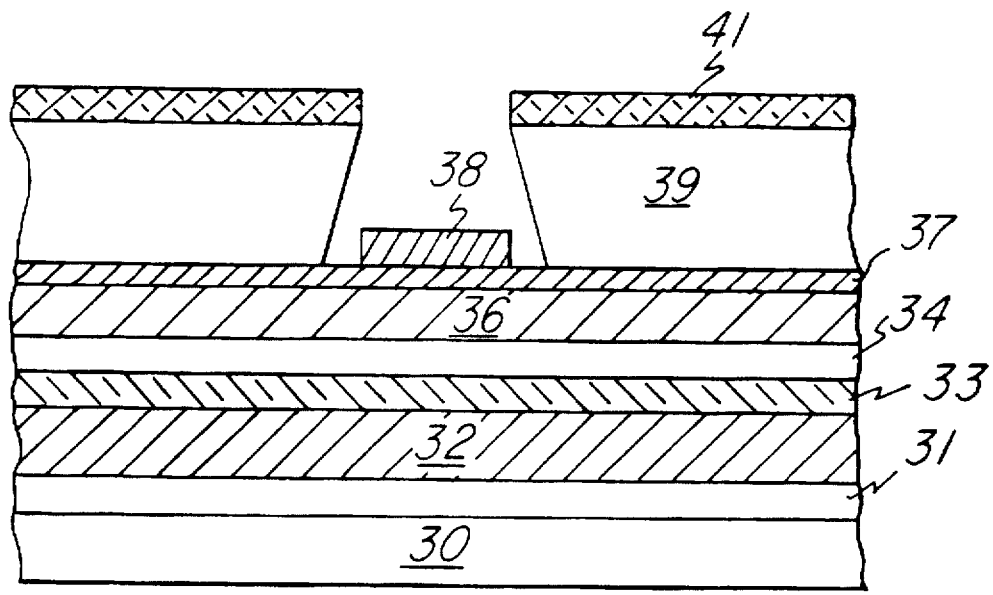

In FIG. 12, photoresist 39 is applied and patterned by lithography. Emitter contact metal 38 is then deposited, consisting of a refractory metal, such as 200 nm WSi. The excess metal 41 on top of the photoresist 39 is then lifted off by dissolving the photoresist in acetone.

Figure 13:
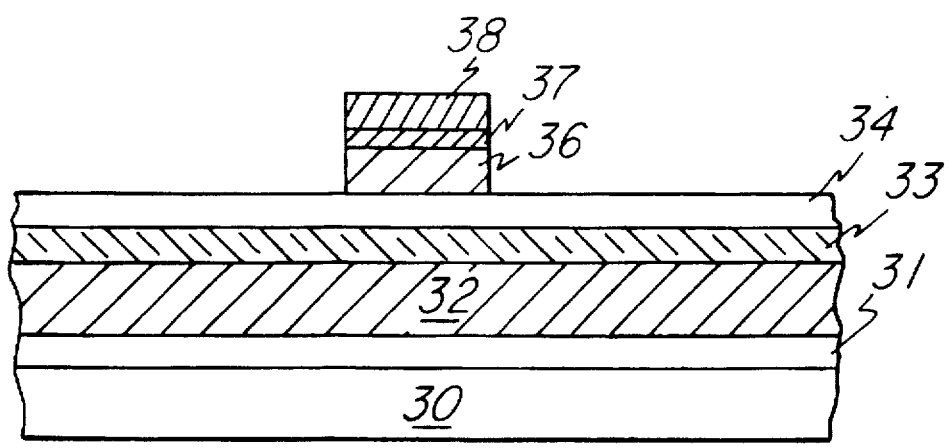

In FIG. 13, the emitter cap 37 and the emitter layer 36 are etched using the emitter contact 38 as a mask.

Figure 14:
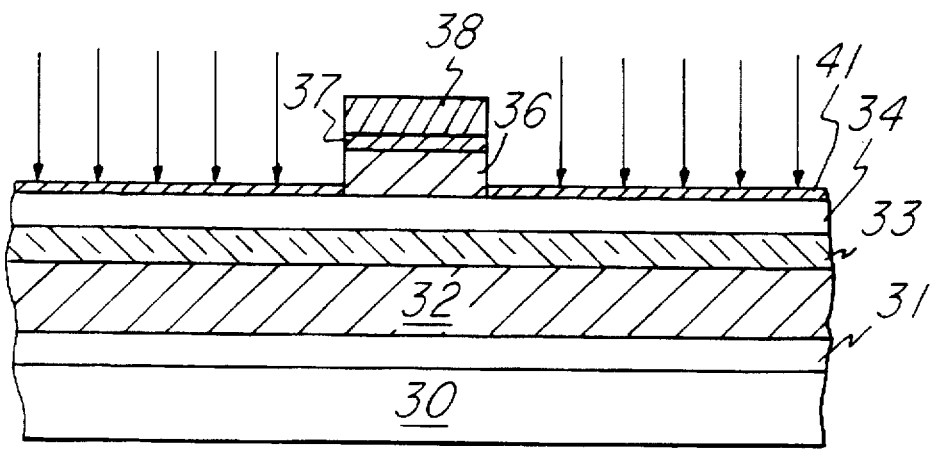
FIGS. 11–22 are cross sectional elevation views of the second preferred embodiment and the steps of the second preferred embodiment fabrication method.

In FIG. 14, 40 nm of silicon nitride 41 is deposited on top of the base layer 34. The structure is then ion implanted (for example, Be at 60 keV to a dose of $1\times10^{14}$ cm$^{-2}$) to convert the collector layer 33 immediately under the base layer in the extrinsic base region. The emitter acts as a mask. The structure is then annealed at 800 C. for 30 seconds to activate the implant.

Figure 15:
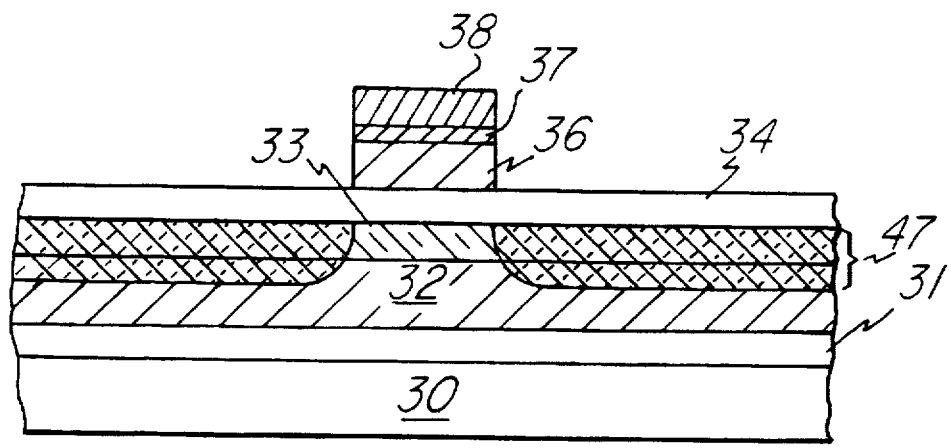

In FIG. 15, the silicon nitride is then removed to leave a ion-implanted portion 47 of the collector layer. The implanted region may extend through the GaAs collector layer 33 and partially into the AlGaAs collector layer 32.

Figure 16:
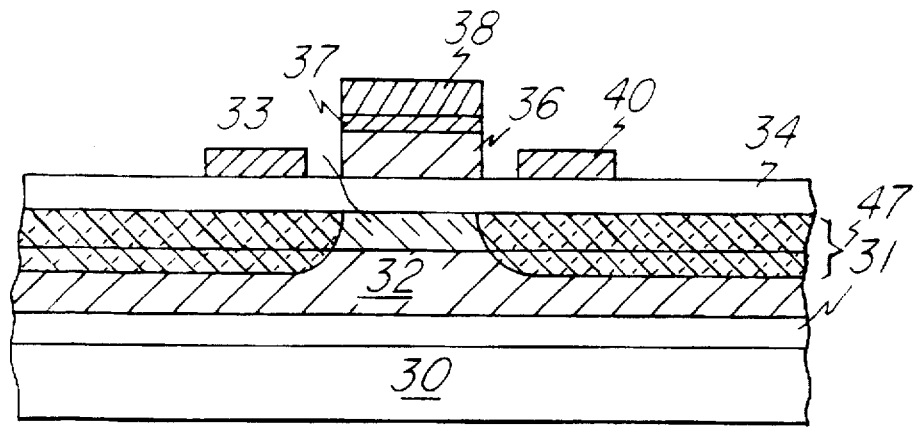

In FIG. 16, the base contacts 40 are evaporated onto the base layer 34 using a lift-off process. The base contact metal consists of 50 nm Ti, 25 nm Pt, and 200 nm Au.

Figure 17:
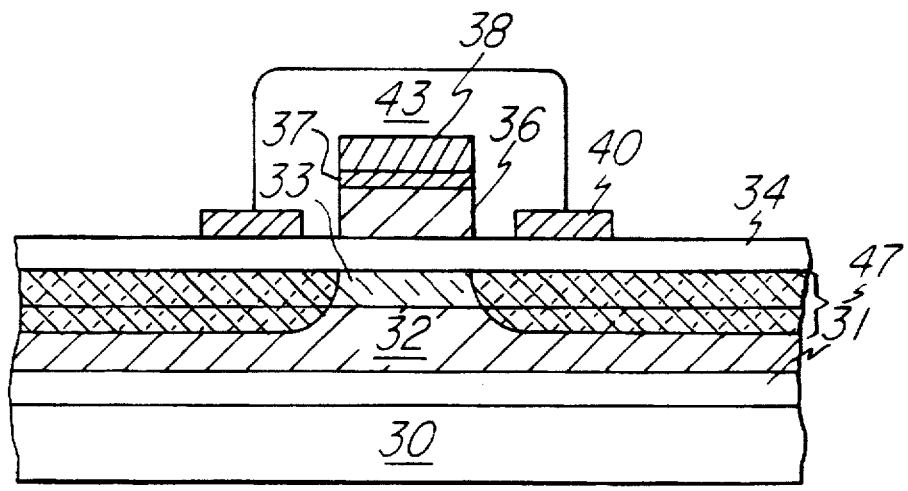

In FIG. 17, a layer of photoresist 43 is deposited and patterned over the emitter and portions of the base contacts.

Figure 18:
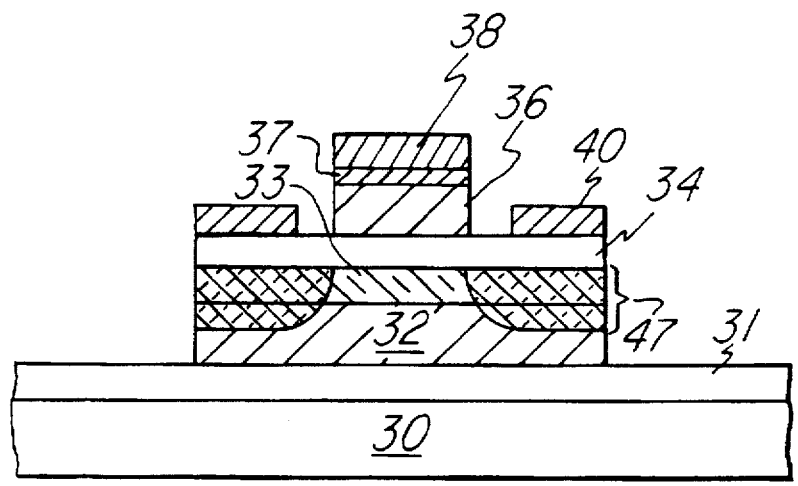

In FIG. 18, the base layer 34 and the collector layers 32 and 33 are etched using the base contact 40 and photoresist 43 as a mask.

Figure 19:
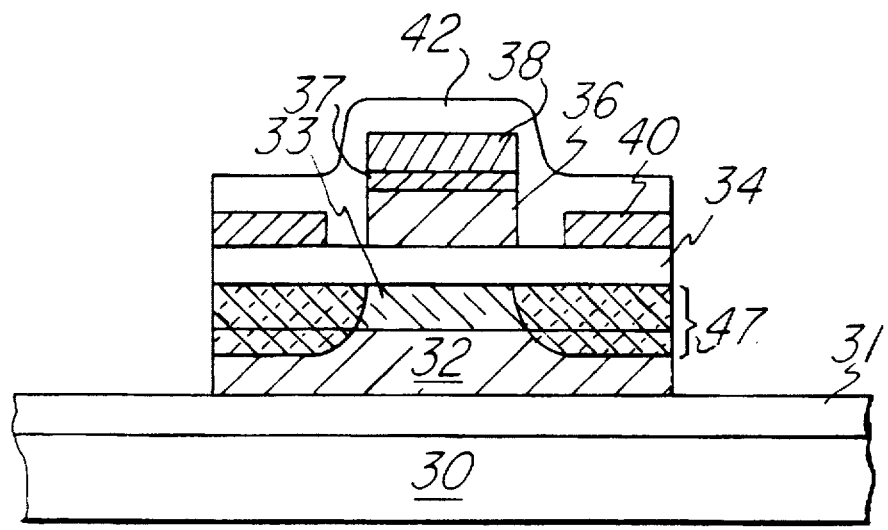

In FIG. 19, a layer of silicon nitride is deposited over the base contact 40, the emitter 36 and the emitter contact 38 to protect the AlGaAs in the emitter.

Figure 20:
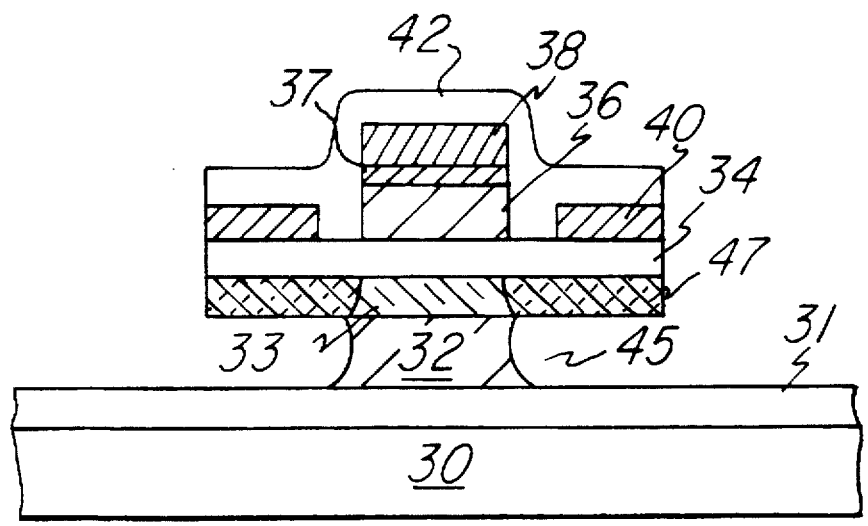

In FIG. 20, a timed selective etch is used to etch the collector layer 32 and produce an undercut 45 beneath the base layer 34. The selective etch may be either dopant selective or material selective.

Figure 21:
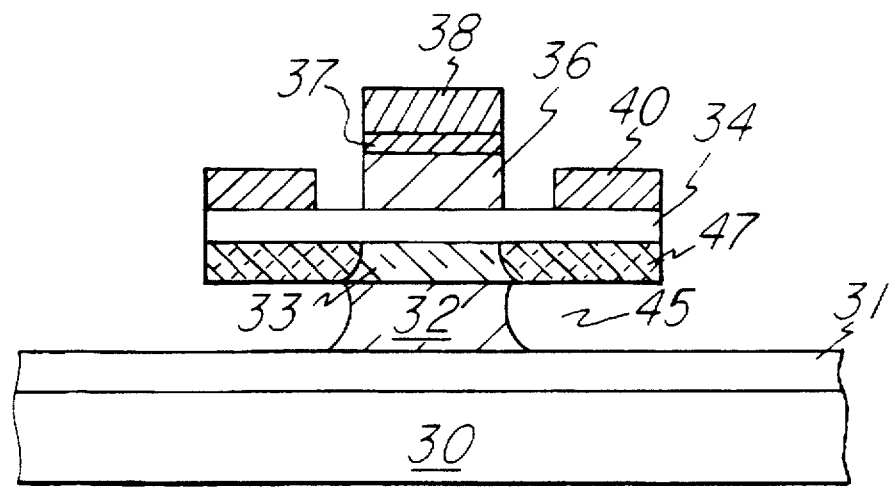

In FIG. 21, the layer of silicon nitride is removed.

Figure 22:
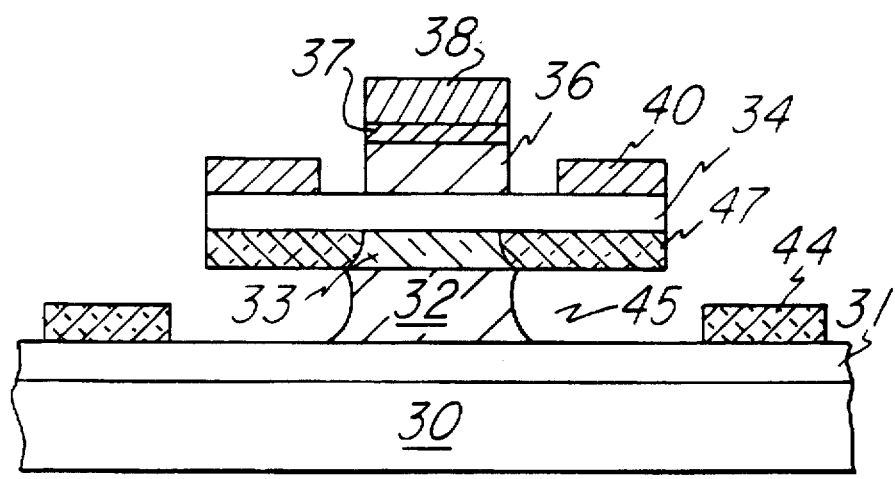

In FIG. 22, 50 nm thick AuGe emitter ohmic contact metal, followed by 14 nm Ni and 200 nm Au layers are evaporated onto the subcollector 31 using a lift-off process to make the collector contact 44. The contacts are then alloyed by heating to 430 degrees Celsius for 1 minute.

What is claimed is:

1. A method for fabricating a bipolar transistor, comprising the steps of:
   a. forming an emitter contact on a material structure including:
      i. a collector layer over a subcollector layer;
      ii. a base layer formed over said collector layer;
      iii. an emitter layer formed over said base layer;

b. removing portions of said material structure from regions not covered by said emitter contact to expose portions of said base layer;

c. doping said exposed portions of said base layer and portions of said collector layer; and d. removing at least a partial thickness of said collector layer from beneath portions of said base layer such that said base layer overhangs said removed thickness.

2. The method of claim 1, wherein said step of doping said exposed portions of said base layer and portions of said collector layer comprises implanting dopant through said base layer into an upper portion of said collector layer.

3. The method of claim 1, wherein said step of doping said exposed portions of said base layer and portions of said collector layer comprises diffusing dopants through said base layer into an upper portion of said collector layer.

4. The method of claim 1, wherein said collector layer comprises a first sublayer of a first semiconductor material over said subcollector layer and a second sublayer of a second semiconductor material over said first sublayer.

5. The method of claim 4, wherein said first semiconductor material is AlGaAs and said second semiconductor material is GaAs.

6. A method for fabricating a bipolar transistor, comprising the steps of:

a. forming an emitter contact on a material structure including:
   i. a first collector layer of a first conductivity type and of a first semiconductor material over a subcollector layer;
   ii. a second collector layer of a second semiconductor material over said first collector layer;
   iii. a base layer of a second conductivity type formed over said second collector layer;
   iv. an emitter layer formed over said base layer;

b. removing portions of said material structure from regions not covered by said emitter contact to expose said base layer; and c. removing a part of said first collector layer from beneath portions of said base layer without removing substantial portions of said second collector layer.

7. The method of claim 6, further comprising the step of doping portions of said base layer and portions of said collector layer.

8. The method of claim 6, wherein said first semiconductor material is AlGaAs and said second semiconductor material is GaAs.

9. The method of claim 7, wherein said step of doping said portions of said base layer and portions of said collector layer comprises implanting dopant through said base layer into an upper portion of said collector layer.

10. The method of claim 7, wherein said step of doping portions of said base layer and portions of said collector layer comprises diffusing dopants through said base layer into an upper portion of said collector layer.

11. The method of claim 1, wherein said collector layer comprises a first sublayer over said subcollector layer and a second sublayer over said first sublayer; and removing at least a partial thickness comprises removing portions of said first sublayer without substantially removing said second sublayer.

12. The method of claim 11, wherein said first sublayer is formed from and of a first semiconductor material and said second sublayer is formed from a second semiconductor material.

13. The method of claim 1, wherein said base layer substantially overhangs said removed thickness.

14. A method of fabricating a bipolar transistor, comprising:

forming a first collector sublayer over a substrate;

forming a second collector sublayer on said first collector sublayer;

forming a base layer on said second collector sublayer;

forming an emitter layer on said base layer;

etching away portions of said first collector sublayer without substantially etching said substrate or said second collector sublayer, such that said second collector sublayer and said base layer are undercut, whereby the junction capacitance is decreased.

15. The method of claim 14, wherein said first sublayer is formed from a first semiconductor material and said second sublayer is formed from a second semiconductor material.

16. The method of claim 14, further comprising doping portions of said base layer and portions of said second collector sublayer.

* * * * *